United States Patent [19]

Culp

[11] Patent Number: 5,262,696
[45] Date of Patent: Nov. 16, 1993

[54] BIAXIAL TRANSDUCER
[75] Inventor: Gordon W. Culp, Van Nuys, Calif.
[73] Assignee: Rockwell International Corporation, Seal Beach, Calif.
[21] Appl. No.: 726,441
[22] Filed: Jul. 5, 1991
[51] Int. Cl.⁵ .............................................. H01L 41/08
[52] U.S. Cl. .................................. 310/328; 310/358; 310/359; 310/332; 310/333
[58] Field of Search ............................ 310/357–359, 310/365, 366, 328, 330–332

[56] References Cited

U.S. PATENT DOCUMENTS

| | | | |
|---|---|---|---|
| Re. 23,813 | 4/1954 | Adler | 310/359 X |
| 2,808,524 | 10/1957 | Feinstein | 310/359 X |
| 2,928,068 | 3/1960 | Samsel et al. | 310/358 |
| 2,956,184 | 10/1960 | Pollack | 310/358 |
| 3,114,849 | 12/1963 | Poschenrieder | 310/359 X |
| 3,168,623 | 2/1965 | Petermann | 310/358 X |
| 3,202,846 | 8/1965 | Ballato et al. | 310/97 |
| 3,252,017 | 5/1966 | Bartels | 310/359 X |
| 3,558,351 | 1/1971 | Foster | 117/201 |
| 3,571,632 | 3/1971 | De Jong | 310/357 X |
| 4,202,605 | 5/1980 | Heinz | 350/292 |
| 4,509,153 | 4/1985 | Weight | 310/357 X |
| 4,523,121 | 6/1985 | Takahashi et al. | 310/334 |
| 4,649,313 | 9/1989 | Ogawa | 310/358 |
| 4,928,030 | 5/1990 | Culp | 310/328 |
| 4,961,252 | 10/1990 | Hsu et al. | 310/359 X |
| 5,144,187 | 3/1992 | Culp | 310/328 |

Primary Examiner—Mark O. Budd
Attorney, Agent, or Firm—H. Fredrick; Harry B. Field; Steven E. Kahm

[57] ABSTRACT

This invention is for a single lamina biaxial transducer made of an electrodeformable material. Several methods form making biaxial transducers are taught. The biaxial transducer has responsivity vectors which are directed along radial lines from the axis and change in in intensity with distance from the axis so that when an electric field is applied the transducer will biaxially deform. The biaxial lamina can be stacked with a common electrode between them. Biaxers can be used for reducing stress between layers in bodies. They are also useful in deforming bodies and for making pumps.

22 Claims, 3 Drawing Sheets

BIAXIAL TRANSDUCER

BACKGROUND OF THE INVENTION

1. Field of the Invention

The present invention generally relates to electromechanical transducers and, in particular, to transducers that directly convert an applied electrical signal into biaxial surface deformation.

2. Background Art

The background of the present invention includes biaxial surface deformation of generally solid bodies, associated with dilatation, piezoelectric deformation, and a subclass of mechanically induced strains.

In the Applicant's patent, U.S. Pat. No. 4,928,030 issued May 22, 1990, he describes electromechanical actuators having a responsive surface portion that is forcefully positioned in response to an applied electrical signal. The actuators combine transducer segments called lifters and tangenters that respectively translate the responsive surface perpendicular to, and in the plane of, the responsive surface. The mechanical stroke of the described actuator is the sum of the stroke contributions of the independently electrically stimulated transducer body segments. Separate embodiments of the lifter may use either the extension mode, the thickness mode or the shear mode actions of the respective electrodeformable lifter body. Shear lifter action advantageously entails negligible strain at a bond between the lifter body and another rigid body because no biaxial deformation occurs at the bond. However, lifters using the extension and thickness deformations incur significant stress at bonds because these deformations are irrefutably coactive. The bond of an extension or thickness transducer segment to a rigid member relegates a portion of the segment's unbonded stroke and force to stress in and proximate the bond.

In Applicant's copending patent application, Ser. No. 07/708,643 filed May 31, 1991, he describes transducers that produce a surface twisting by shearing, the direction of twist being generally circular with respect to an axis normal to and passing through a point of the surface of a sheet of electrodeformable material, and the magnitude generally increasing monotonically from zero at the axis to a predetermined maximum value at the extremes of the sheet. Also taught are methods of making twisting transducers by uniformly radially sensitizing a sheet with subsequent adjustment to radially varying magnitude of responsivity by partial desensitization, by activating a sheet in a predetermined manner using nonuniform electric fields, and by applying a radially varying activating electric signal. Biaxial deformation transducers and methods of making same are not described.

U.S. Pat. No. 4,202,605 of Heinz issued May 13, 1980 describes an optical mirror that is deformed in a predetermined manner by the concerted action of a multitude of triaxial piezoelectric transducers. Each transducer incorporates a piezoelectric body portion of each of the respective orthogonal directions. Each portion consists of many sheets of piezoelectric material bonded together with intervening insulating layers. Portions are similarly bonded together to constitute the transducer body. One of the body portions uses the thickness piezoelectric deformation that is irrevocably accompanied by a biaxial surface deformation. The biaxial deformation causes internal stress and strain in each bond with another transducer body portion and in the bond to a rigid support means, thereby sacrificing a portion of the otherwise available free-body stroke and force to bond stress. Electrically insulating layers are taught as a means to provide electrical independence of each layer of the transducer body, and of each motional segment of the body. Insulating layers reduce the fraction of the volume of the body of the transducer that contributes a useful forceful stroke. The insulating layers add to the length of the transducer body, thereby reducing the rigidity of the transducer in directions that tend to bend the body as a cantilever beam. Some of the characteristics of an ideal transducer not taught by Heinz are: maximum electromechanical efficiency gained through the use of no insulating layers; maximum rigidity by obviating insulating layers; and, full free-body forceful stroke of every body portion obtained by avoiding stresses in bonds due to frustrated biaxial surface deformation.

U.S. Pat. No. 3,558,351 issued Jan. 26, 1971 describes methods representative of those used to make shear electrodeformable materials by depositing volatilized material at an angle to the plane of deposition. The methods as taught do not produce deposited electrodeformable material with other than uniform magnitude and direction of responsivity within an individual material body.

U.S. Pat. No. 3,202,846 issued Aug. 24, 1965 is representative of the known methods of cutting an intrinsically electrodeformable material to obtain a desired electrodeformation, for example, shear, or shear combined with another mode of deformation. The benefit of intrinsically electrodeformable material is that sensitizing for electrodeformation by a temporary electrical connection is not required before application of permanent activating electrical connections. Another benefit of intrinsically electrodeformable materials is their general tendency to recover essentially full responsivity after cooling from a prescribed temperature above which responsivity is temporarily reduced or even disappears.

U.S. Pat. No. 4,523,121 issued Jun. 11, 1985 teaches methods of reducing operating stress in thickness mode piezoelectric transducers that have end sheets lying near the rigid bonding surface by progressively increasing sheet thickness in proportion to the proximity of the rigid bonding surface. When all sheets have the same applied electric potential, electric field intensity decreases in inverse proportion to sheet thickness. Reduced electric field intensity results in reduced piezoelectric deformation. An infinitely thick sheet bonded to the rigid surface will reduce the stress there to zero. In practice, there is generally insufficient space available for an infinitely thick sheet. In addition, the rigid bonding surface has finite elastic modulus that accommodates some of the stress by means of elastic shear compliance. However, progressively thicker sheets near the rigid bonding surface increase the size and therefore the axial elastic compliance of the actuator. Increased compliance decreases the forceful stroke otherwise available from the more compact actuator.

U.S. Pat. No. 4,649,313 issued Sep. 19, 1989 in the context of thickness-mode piezoelectric wafer stacks, teaches an intermediate piezoelectric thickness mode layer near the rigid bonding surface, the piezoelectric response of which is made less than that of the neighboring and main body layers. The forceful stroke of the intermediate layer is decreased in proportion to the decrease in piezoelectric responsivity. Although an intermediate layer with zero responsivity affixed to the rigid support means would affect zero operating stress at the bond, the intermediate layer would merely replace the rigid substrate at the bond to the transducer layer on the opposite side. Therefore, an intermediate value of responsivity of an intervening layer effectively divides up the stress between wafer interfaces but does not eliminate the stress. The intermediate layer still decreases the forceful stroke otherwise available from the same actuator having every layer with the greater piezoelectric responsiveness.

Known materials exhibit reversible plastic deformation when stressed below the value commonly referred to as the elastic limit. Very rigid and intrinsically accurate positioning transducers, typified by piezoelectric embodiments, also exhibit reversible plastic deformation. In general, the amount of deformation is related to the magnitude of the stress and to the time the stress obtains. An ideal transducer that stores relatively little energy of elastic strain, particularly in bonds between body portions and bonds to other rigid components of an apparatus retains the preponderance of its inherent transducing accuracy and stability with time.

OBJECTS OF THE INVENTION

A primary object of the biaxial transducer is to produce electrically controllable biaxial surface deformation.

Another object is to reduce to zero by electrical control a biaxial surface stress in the transducer and in the object to which the transducer is proximate or attached.

A further object is to accommodate differential thermal expansion between the transducer and another object without stress.

A beneficial object is to increase the useful stroke and force of transducers that produce biaxial surface deformation.

Still another object is providing an electrically controlled biaxial surface deformation for the calibration and performance diagnosis of strain measuring transducers.

Another object is to electrically resonate at many different frequencies.

Yet another object is to provide electrical control of the figure of an optical component.

An additional object is to pump fluid using biaxial surface deformation.

Other objects, advantages and novel features of the present invention will become apparent from the following Detailed Description of the invention when considered in conjunction with the accompanying Drawings.

SUMMARY OF THE INVENTION

The objects and advantages of the present invention are attained by an electromechanical device for providing biaxial surface deformations such as occur in piezoelectric devices, thermally dilated bodies and the like.

The electromechanical device consists of at least one electrodeformable body with a responsive surface and electrical connections to a source of activating signals. Actions of the responsive surface include in part: accommodation of large strains with reduced stress; deforming of adjunct structures; and, the pumping of fluid.

DETAILED DESCRIPTION OF THE INVENTION

Figure 1:
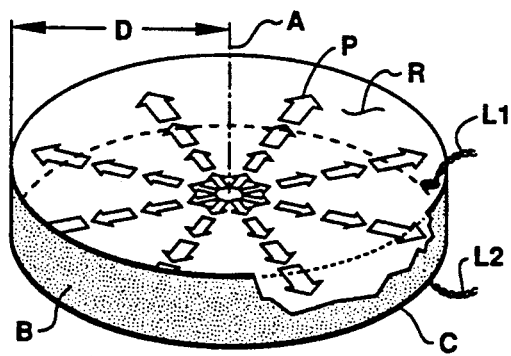
FIG. 1 is a quiescent phantomed perspective view of a presently preferred inventive transducer embodiment called a biaxer having a prescribed arrangement of responsivity vectors of the transducer body.

Dilatation is herein defined as the propensity of a body to spread out or extend in all directions. Dilatation is characteristic of a body undergoing an increase in volume due to an increase in temperature, due to chemical swelling action, and such like. A surface portion of a body, with respect to another plane of the body that is considered stationary for reference, manifests dilatation by two actions, a translation normal to the plane of the surface, and a biaxial surface deformation.

Biaxial surface deformation is herein defined as the deformation in which any point of the surface translates essentially in the plane of the surface. Translation of a point of the surface perpendicular to the surface may occur but is considered incidental in the context of the present invention. During a biaxial surface deformation, the change in distance between any pair of points of the surface is proportional to the distance between the points, and is also proportional to the magnitude of the deformation. Relative to a point of the deforming surface that is designated the stationary origin of a reference coordinate system, the change of location of each point of the biaxially deformed surface is proportional to the distance of that point from the origin, and is also proportional to the magnitude of the biaxial surface deformation.

Non-dilatory deformation includes piezoelectric deformation and biaxial stretching. Piezoelectric deformation is a special case in which a piezoelectric sheet, in response to an applied electric field, increases in the sheet thickness direction and shrinks in the other orthogonal directions (parallel to each broad measure of the sheet) but without significant change in the volume of the sheet.

Biaxial stretching of a sheet of essentially incompressible material, such as rubber, increases both broad dimensions with a decrease in thickness, while again, the volume of the sheet remains essentially constant. These and related non-dilatory deformations of a broad surface also generally have two coacting components, a biaxial surface deformation and a surface-normal translation.

Shear is herein defined as the translation of a first plane of a body parallel to a second plane of the body without significant change in body volume, and without significant change of the gross measurements of the body. Shear, in the sense usually associated with elastic theory, proceeds without a change in the shape of any body plane parallel to the planes of shear. However, in the context of the present invention, gradient shear is herein defined as a shear deformation that changes in a combination of magnitude and direction in a slowly varying manner relative to an arbitrary point, line or plane, but predominantly to a line. Slowly varying as defined for this context, is a rate of change with regard to spatial coordinates that produces little difference of state of one small but finite element of a body relative to the state of an adjacent small but finite element. Joint discontinuities and related sudden changes of state at a point, line or plane of a body are herein excluded. State, in the present context, includes the measurable physical properties of electrical signal intensity as responded to by the transducer body, and more specifically, electric field intensity, electric current density, magnetic flux density, temperature, electroelastic strain or stress, and the various electromechanical responses of bodies generally associated with transducers.

FIG. 1 is a quiescent phantomed perspective of a biaxer, a transducer that produces a biaxial surface deformation in response to an applied electrical signal. The biaxer consists of a body B comprising a lamina of shear electrodeformable material having responsivity vectors P, a support surface C, a responsive surface R, and electrical connecting leads L1, L2. Leads L1, L2 connect body B to a source of electric signals (omitted for clarity). Although illustrated as a portion of a cylinder with central axis A, body B may have any shape that has two, generally opposite, broad surfaces. Broad surface C is considered a stationary surface for reference. Responsivity vectors P represent properties of the electrodeformable body B that cause responsive surface R to deform when an electrical signal is applied. In the biaxer, responsivity vectors P are distributed radially relative to axis A. The size of arrows P increase with distance from axis A indicating a radial increase in the magnitude of responsivity. In the preferred biaxer arrangement, responsivity vectors have zero magnitude at axis A and maximum magnitude at the extremity of body B, such as at distance D from axis A. The magnitude of responsivity is a slowly varying function of distance from axis A.

Figure 2:
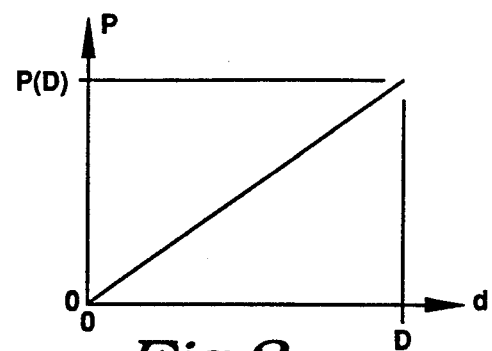
FIG. 2 plots the variation of responsivity vector magnitude with distance from an axis of the biaxer of FIG. 1.

FIG. 2 plots the slowly varying responsivity P from zero responsivity at zero distance, to maximum responsivity P(D) at distance D from a reference axis, such as axis A of FIG. 1. The relationship is shown linear by way of example, when the inherent responsivity of the shear electrodeformable material of the transducer is linear. Embodiments of the biaxer having nonlinearly responsive electrodeformable material have nonlinear radial distributions of responsivity such that the responsive surface R of FIG. 1 is linearly radial.

Figure 3:
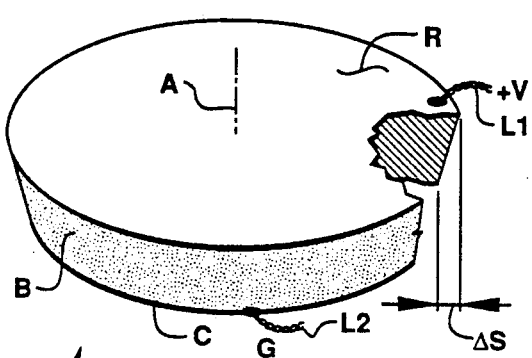
FIG. 3 is a cutaway view of the biaxer of FIG. 1 showing a deformation stroke caused by an applied electrical signal.

FIG. 3 is a perspective partial cutaway of the biaxer of FIG. 1 activated by the application of an electrical signal +V to lead L1, while lead L2 is held at electrical ground G for reference. The combination of the applied electric signal and the set of responsivity vectors P of body B (FIG. 1) causes responsive surface R to execute a biaxial surface deformation relative to axis A as measured by shear stroke $\Delta S$ at an extremity of body B.

By way of example, an embodiment of biaxer body B is made of piezoelectric electrodeformable material of the shear type, broad surfaces R and C have film electrodes covering them, and the size of each of the responsivity vectors P corresponds to the respective shear piezoelectric coefficient $d_{15}$. The essentially uniform electric field between the electrodes is perpendicular to $d_{15}$ vectors, and the magnitudes of the vectors $d_{15}$ increase smoothly from zero at axis A to a maximum at the disk edge. It is not essential that responsivity vector magnitudes increase linearly, nor is it essential that the magnitude of the applied electric field is uniform, but it is necessary that the transducer response due to the combined effects increases smoothly and linearly with distance from axis A to produce a biaxial surface deformation of responsive surface R. Also included in the necessary conditions for a biaxial surface deformation is a disregarding of, or a compensation for, local loss of shear stroke due to the constraint of surface C. The shear stroke loss due to the constraint of surface C is generally negligible when the stroke at the body extremity is small, an operating condition prevalent in a diverse class of devices that may include a biaxer.

Figure 4:
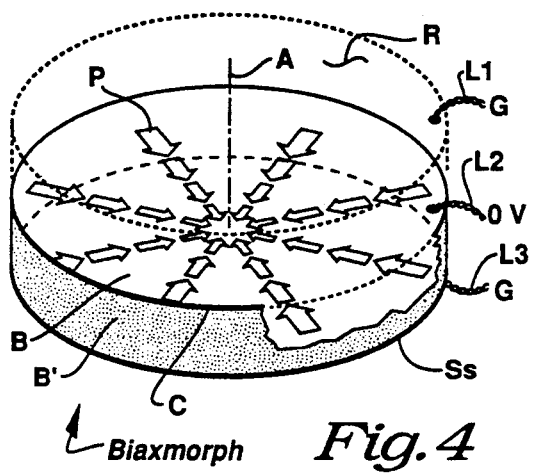
FIG. 4 shows a quiescent partially phantomed perspective view of a presently preferred inventive transducer embodiment called a biaxmorph, consisting of proximate biaxers.

FIG. 4 shows a quiescent partially phantomed view of a biaxmorph, a two-part embodiment of the present invention consisting of the biaxer body B of FIG. 1 combined at common surface C with another biaxer body B' that is similar but has antiparallel responsivity vectors. The responsivity vectors of body B are omitted for clarity. Electrical connections are made with leads L1 and L2 from the biaxer of FIG. 1 and the lead L3 of body B'. The two-part body thus formed has a common axis A of zero responsivity, a base support surface Ss considered to be held stationary for reference, and a responsive surface R of the composite transducer.

Figure 5:
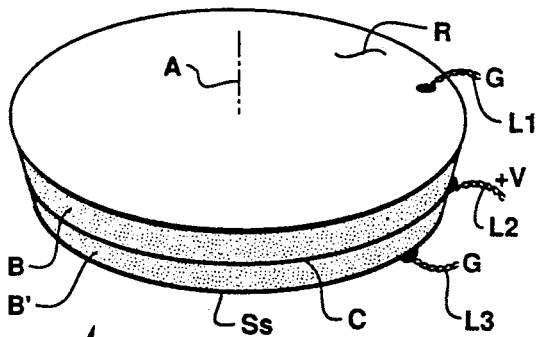
FIG. 5 is an activated perspective view of a constrained biaxmorph producing a deformation stroke in response to an applied electrical signal.

FIG. 5 shows the activated biaxmorph of FIG. 4 after the application of an electric signal +V to common connection lead L2 referenced to ground G of leads L1 and L3. Using the previous example of the piezoelectric embodiment, electric signal +V applied to electrode C creates equivalent but antiparallel electric fields in bodies B, B' which, in combination with antiparallel responsivity vector directions, causes equivalent biaxial surface deformations of the same sense. The biaxial surface deformation of responsive surface R relative to support surface Ss is the sum of the stroke contributions of the body portions, less the strains at interfaces C and Ss. The measure of the biaxial surface deformation is as described for FIG. 3.

Figure 6:
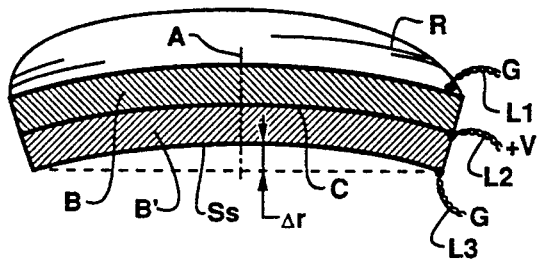
FIG. 6 perspectively illustrates the stroke of a free biaxmorph having biaxial and curved surface deformations resulting from an applied electrical signal.

FIG. 6 is a cutaway perspective of the activated biaxmorph of FIG. 5 but with supported surface Ss unconstrained, thereby allowing a deformation comprising a smoothly varying shear and a curvature change $\Delta r$ on supported surface Ss. A diverse class of devices benefits from the capability to electrically control curvature, for example, electrically focusable optical lenses and mirrors, and electrically damped structures. A biaxer or biaxmorph attached edgewise to and closing a wall portion of a vessel provides electrical control of the volume of the vessel, thereby constituting electrically tunable acoustic resonators, pump cavities, and pressure modulators for fluid ejection devices such as ink jet printing apparatus.

Figure 7:
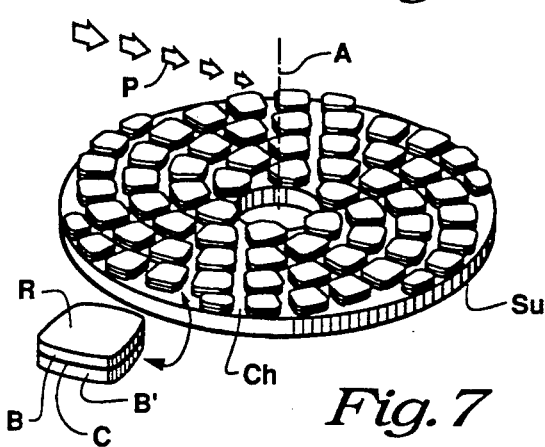
FIG. 7 perspectively shows a segmented biaxmorph on a support substrate.

FIG. 7 is a perspective view of a segmented biaxmorph comprising a multiplicity of biaxmorph segments, the enlarged representative one of which having body portions B, B' usually possessing antiparallel responsivity directions, an active electrical connection C, a responsive surface R, and an opposite supported surface supported by substrate Su. The arrangement of responsivity of the array of biaxmorphs is generally shown as P symmetrically arrayed about axis A. Electrical connections and wiring are omitted for clarity. Preferred morphology for the segmented embodiments arranges essentially equally sized segments at equal intervals along the arms of a set of involute spirals, allowing essentially uniformly spaced channels Ch between of segments. Channels Ch are greatly exaggerated in the figure for clarity. The base circle that defines the geometry of the set of involute spirals is shown as a hole in substrate Ss only for clarity and is not essential to the operation of the segmented biaxer or biaxmorph.

The magnitude of responsivity P may be a continuous, slowly varying function of distance from axis A. Alternatively, each segment may have a distinct homogeneous magnitude, in accordance with the methods of making same referenced forward.

A large and diverse class of actuators is made by stacking a multiplicity of plates, each plate using the piezoelectric thickness mode to forcefully position a transducer end portion in a direction normal to the plane of the end. Although the example is couched in terms of piezoelectric thickness mode transducers, transducers other than piezoelectric that accompany a generally axial translational mechanical stroke with a biaxial surface deformation of the positioned plane are considered within the scope of the present invention.

Figure 8:
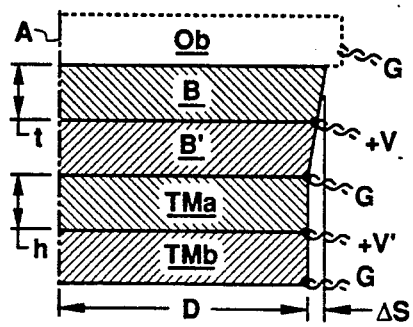
FIG. 8 is a cross section of an end of a compound transducer comprising biaxmorph and thickness mode portions.

FIG. 8 shows an electrically activated cross section view of a compound actuator having two portions, a biaxmorph B, B', and a thickness mode piezoelectric portion TMa, TMb. The compound transducer is shown as a figure of revolution about axis A, and only two of a multiplicity of layers of transducer portion TM are shown for clarity. Rigid object Ob is affixed to and moved by the transducer. An opposite end (not shown) is considered to be held stationary for reference. The two transducer portions are independently electrically activated by separate electrical signals +V and +V' applied to respective active electrical leads. Other connections G are electrically grounded. Signal +V causes biaxmorph B, B', to execute a biaxial surface deformation measured at distance D from rotational symmetry axis A as stroke $\Delta S$. Similarly, signal +V' causes transducer portion TMa, TMb, to produce its main translatory stroke parallel to axis A. The main translatory stroke is accompanied by a biaxial surface deformation of the top surface of layer TMa. Zero stress but large strain at the interface of portions B' and TMa obtains when the two transducer portions have equal biaxial surface deformations $\Delta S$.

As an example, consider the transducer of FIG. 8 constituted of layers TM made of "Navy Type IV" piezoelectric material, thickness h of 0.51 mm, dimension D of 12.7 mm, and an extension responsivity $d_{31}$ of 56 pm/volt (1 pm=$1.0 \times 10^{-12}$ meters). A biaxial surface deformation stroke $\Delta S$ of 0.7 $\mu$m at D results from the application of +V' of 500 volts. Also consider layers B, B', constituted of "Navy Type II" piezoelectric material, thickness t of 0.51 mm, dimension D also of 12.7 mm, and having a shear responsivity $d_{15}$ of 697 pm/volt. Application of +V of 500 volts causes a biaxial surface deformation stroke $\Delta S$ of 0.70 $\mu$m that is the sum of the two 0.35 $\mu$m contributions from each of the layers B, B' (neglecting, or compensating for by overdrive, any stroke deficiency due to internal strain). This particular geometric end electrophysical property arrangement provides transducer operation with large strain but zero stress at the interface between layers B' and TMa.

In the example embodiment of FIG. 8, the values of +V and +V' resulting in transducer operation without stress were the same, permitting transducer activation with only two leads and one signal source. Other embodiments allow electrical stimulation of each active electrode with a separate signal in accordance with the responsivities of transducer portions. For example, an augmentation of signal +V compensates for any stroke frustration by a bond to a rigid object, such as Ob. Practical transducers have nonlinear electromechanical response. Separate electrical activation of each portion of the subject transducer with complementary nonlinear electric signals produces linear or other desired mechanical transducer output transfer function as required to maintain a prescribed state of interlayer stress at any value of transducer drive level.

Figures 9, 10, 11:
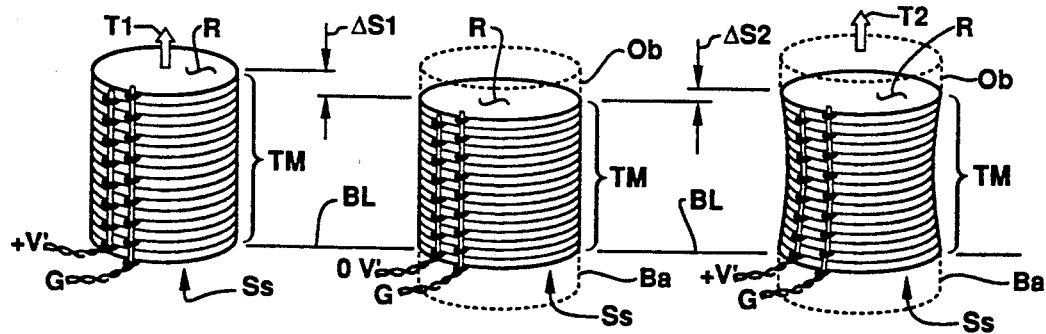
FIG. 9 shows the translation and biaxial surface strokes of a free piezoelectric transducer.
FIG. 10 shows the quiescent stance of the transducer of FIG. 13 bonded at each end to rigid members.
FIG. 11 shows the translation stroke and body deformation of the transducer of FIG. 9.

FIG. 9 is an activated perspective of a transducer comprising a stacked layer piezoelectric thickness mode body TM configured to translate responsive surface R in direction T1 relative to stationary reference support surface Ss in response to an applied electric signal +V' relative to electrical ground G. The diameter of body TM has decreased commensurate with the increase in its length in direction T1, and with the physical requirement that body volume is invariant with deformation state (excluding extraordinary hydrostatic pressure).

FIG. 10 is a quiescent perspective of the transducer of FIG. 9. Responsive surface R is attached to and is configured to translate rigid object Ob, while support surface Ss is attached to rigid stationary base Ba, thereby constraining biaxial surface deformation at both ends of the transducer body.

FIG. 11 is an activated perspective of the constrained transducer of FIG. 10, showing translation in direction T2 of positionable object Ob by responsive surface R resulting from the application of the same electric signal +V' used to produce translation in FIG. 9. Transducer body portions near the constrained ends execute a lesser biaxial surface deformation than portions more distant from the constrained ends, resulting in the hour glass shape (exaggerated in the figure for clarity).

The translational stroke ΔS1 of the unconstrained transducer (FIG. 9) is significantly greater than the translational stroke ΔS2 of the same transducer excited by the same magnitude of electrical signal but with end constraints (FIG. 11) because end constraints relegate a portion of the deformational energy to transverse shear of body TM.

Figures 12, 13:
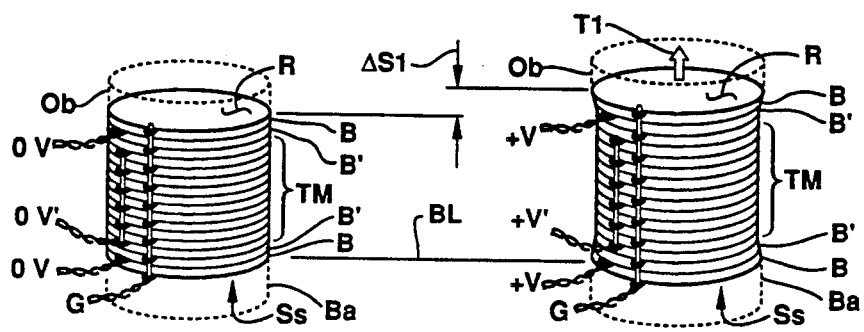
FIG. 12 illustrates the quiescent state of the transducer of FIG. 9 bonded at each end to rigid members by intervening biaxmorphs.
FIG. 13 depicts the full stroke of the transducer of FIG. 9 attained by the transducer of of FIG. 12.

FIG. 12 shows a composite transducer consisting of the body TM of FIG. 10 to each end of which is affixed a biaxmorph B, B'. The responsive surface R of the upper biaxmorph is affixed to rigid translatable object Ob, while the stationary support surface Ss of the lower biaxmorph is affixed to rigid base Ba.

FIG. 13 is an activated perspective of the composite transducer of FIG. 12. Application to body portion TM of the same electric signals +V' used to produce mechanical stroke ΔS1 of FIG. 9, and application of signals +V to both biaxmorphs, all relative to electric ground G. produce the same translation ΔS1 of object Ob when large strain but zero stress obtains at the interface between the biaxmorph B' and body portions TM. The diameter of body portion TM has decreased uniformly, while the biaxial surface deformation of biaxmorphs, as previously described for FIG. 8, has accommodated the decreased diameter at the ends of the body of TM.

Figure 14:
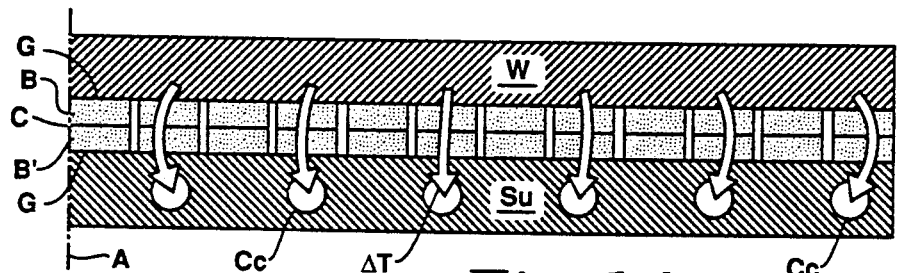
FIG. 14 is a cross section view of a wafer-scale integrated circuit bonded to a cooling substrate with an intervening segmented biaxmorph.

FIG. 14 is a quiescent semisection view of an embodiment of the segmented biaxmorph of FIG. 7 but having biaxmorph segments rigidly affixed between a substrate Su and wafer-like object W. Each biaxmorph segment has antiparallel responsivity body portions B, B', grounded outer electrodes G, and a common active electrode C. Electrical connections are omitted for clarity. Wafer W, by way of example, may be a wafer-scale integrated electronic circuit that requires cooling. Substrate Su may optionally incorporate a multiplicity of fluid cooling channels Cc that remove heat ΔT from wafer W.

Figure 15:
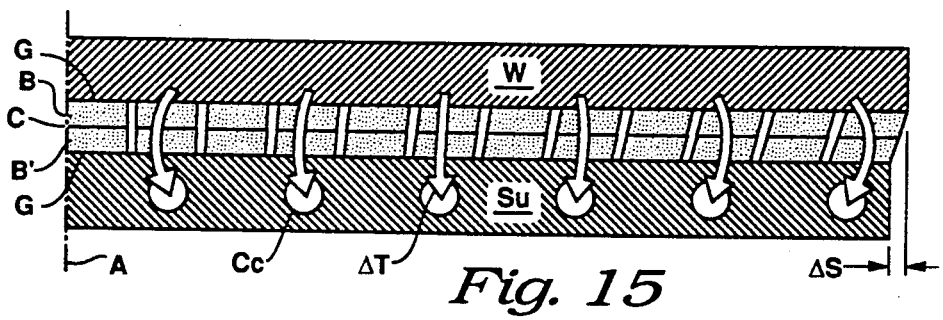
FIG. 15 illustratively demonstrates accommodation of a wafer dilatation.

FIG. 15 is an activated view of the apparatus of FIG. 14 in which, from whatever cause, the volume of wafer W has become larger than the volume of substrate Su. A volume change, as would occur in the example due to a difference of temperature, is accompanied, ignoring the normal surface translation, by a biaxial surface deformation, one measure of which is edge stroke ΔS. Biaxmorph segments B, B', have sheared as a result of the application of a predetermined electric signal to electrodes C such that everywhere in the wafer body a state of substantial strain, but zero stress, prevails. The biaxmorph segments have sheared by a magnitude that increases in proportion to the distance from axis A, thereby affecting a biaxial surface deformation exactly equal to that which has occurred due to the difference of size of wafer W and substrate Su.

Figure 16:
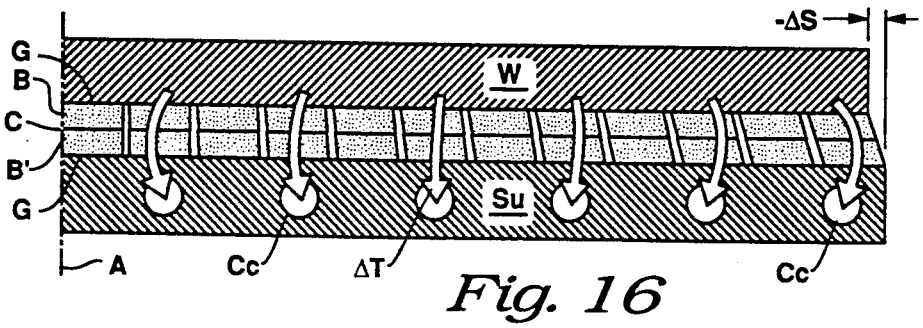
FIG. 16 illustratively demonstrates accommodation of a wafer shrinkage.

FIG. 16 is an activated view of the composite body of FIG. 14 wherein wafer W has become smaller than substrate Su as measured by an edge stroke −ΔS. The application to biaxmorph segment electrodes C of a prescribed electric signal, generally of opposite sign as that used in FIG. 15, results in the maintenance of the states of substantial strain, but zero stress, throughout the wafer body.

The states of extensive strain but zero stress in embodiments typified by FIGS. 14-16 are maintained by segmented biaxers and biaxmorphs while preserving an essentially solid composite structure. The preponderance of the surface area proximate the wafer and the substrate is thermally connected by means of biaxmorph segments. The essentially solid structure constituted by the present invention generally has higher thermal conductivity than one made of separate portions simply supported or bonded with adhesive. Zero stress precludes any tendency to delaminate layers due to relatively large shear or peel stresses, to reduce thermal conductivity due to delamination, and thereby to maintain a beneficial effectiveness of heat removal by body conduction.

Figure 17:
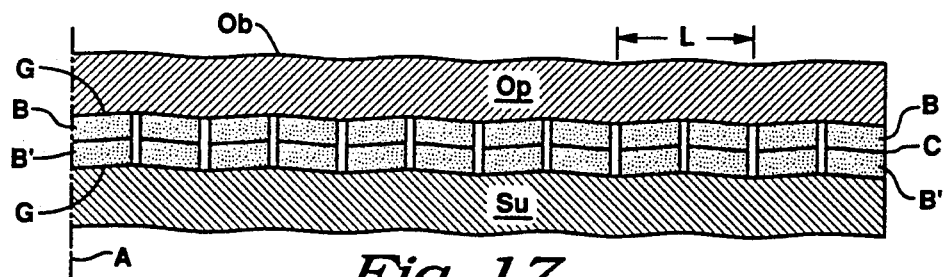
FIG. 17 is a cross section of a deformable mirror articulated by independently electrically addressed biaxmorph segments.

FIG. 17 is a semisection view of a deformable object Ob connected to a substrate Su by biaxmorph segments B, B', each segment shearing by a prescribed magnitude and direction by the application of a separate prescribed electric signal to respective common electrodes C. The effect of the shearing segments is to bend the composite structure with, by way of example, a minimum spatial frequency wavelength L. Object Ob may be a deformable mirror or other object deriving benefit of electrical control of high spatial frequency deformation.

Figure 18:
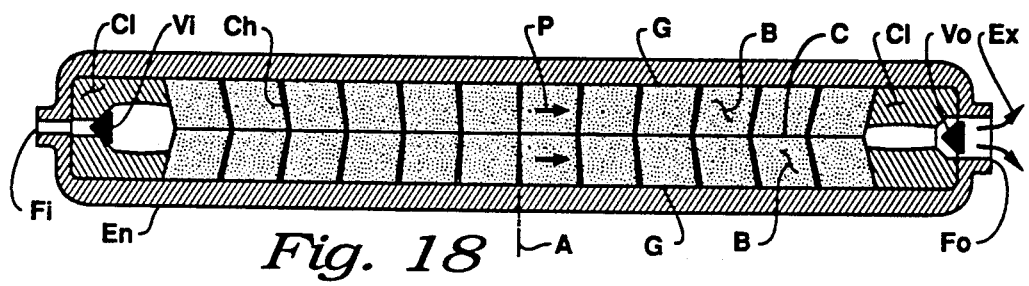
FIG. 18 is an intake cross section of a fluid moving embodiment of a segmented biaxer.

FIG. 18 is an activated section view of a fluid pumping apparatus of revolution about axis A comprising enclosure En containing biaxmorph segments B, fluid inlet Fi, fluid outlet Of, inlet valve Vi, outlet valve Vo, and compliant closure Cl. The pump is shown concluding a fluid exhaust stroke. Unlike the segmented biaxmorph previously described for FIG. 7, the bodies B of FIG. 18 have parallel responsivity vectors. Atypical of solid transducer bodies, the parallel segmented biaxmorph, as a body, changes volume in response to electrical activation. The parallel responsivities, in combination with an electric signal applied to common electrodes C, and with the radial magnitude distribution of responsivities characteristic of biaxmorphs, causes fluid channels, generally indicated Ch, to expel fluid as channels Ch are partially occluded by biaxmorph segment shear deformation. Valve Vi is closed while the pressure of expelled fluid Ex opens valve Vo.

An alternate embodiment of the pump of FIG. 18 has common electrodes C thickened to increase volumetric stroke. A variant has a rigid member (not illustrated) affixed between the common electrodes of each opposing pair of biaxers to increase volumetric stroke. The height of intervening members is limited by the bending due to pump pressure differential.

Figure 19:
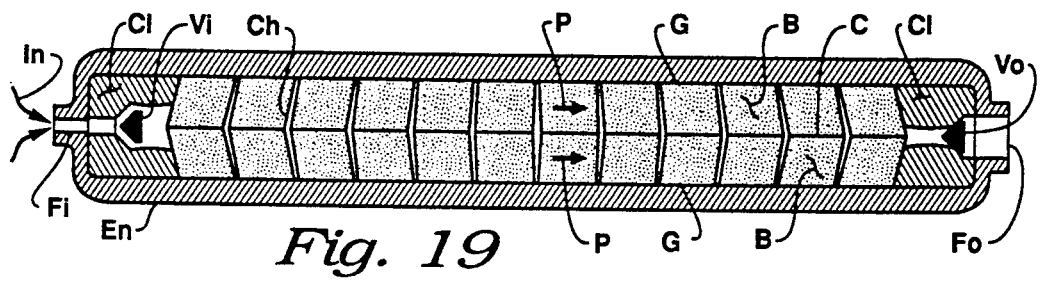
FIG. 19 is an exhaust cross section of the embodiment of FIG. 18.

FIG. 19 shows the conclusion of an intake stroke of the pump of FIG. 18 by the application of an electrical signal, generally of the opposite sign, to common electrodes C of biaxmorph segments B. The volume changes of the biaxmorph body as a whole, and of channels Ch individually, cause valve Vo to close and fluid In to enter inlet duct Fi.

The pump embodiment of the biaxmorph, typified by FIGS. 18. 19, having the inherent rigidity of a solid object, is useful for the generation of relatively high pressure. Small embodiments are applicable to pumping a relatively small volume of fluid in the range of zero to a few microliters. By way of example, a small in vivo embodiment having piezoelectric shear biaxmorphs is applicable to electrically controlled, essentially steady but low-rate infusion of fluid drugs, medicines, and other substances that, when otherwise infused, are intolerably toxic. The biaxmorph pump is readily capable of infusing insulin for the treatment of the chronic diabetic without the known side effects attributed to less frequent bolus injections. Surfaces of the biaxmorph segments and electrical connections are coated with electrically insulating material that is compatible with the infused substance, for example, condensed linear polyparaxylylene. The advantage of the high pressure capability of the biaxmorph pump is the maintenance of infusion rate despite delivery lumen occlusion due to in vivo protein encapsulation, coalescence or crystallization of infusion substance, and related phenomena known to interrupt infusion even when delivery pressure is relatively high. The piezoelectric shear embodiment of the biaxmorph pump, in addition to high delivery pressure and positive displacement, provides inherent high electromechanical efficiency that converts the preponderance of available electrical battery power to useful mechanical work on the pumped fluid. Preferred embodiments of the positive displacement biaxmorph pump use positively actuated valves rather than the passive, spring-return valves illustrated. Preferred valve actuation is by piezoelectric positioners.

Figure 20:
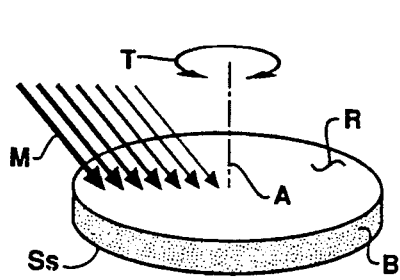
FIG. 20 illustrates a method of producing a biaxer.

FIG. 20 illustrates an intermediate state of fabrication of one of the presently preferred methods of making biaxers and biaxmorphs. Body B is shown with a partially fabricated responsive surface R in process of construction by the angled deposition of material M. The deposition creates the aforedescribed radial distribution of direction and magnitude of responsivity vectors about axis A. The angle of incidence and rate of deposition of material are controlled indicated by the varying thicknesses of arrows M. The radial arrangement of responsivity vectors required for a biaxer or a biaxmorph is obtained by rotating body B about axis A in directions T at a prescribed rate during deposition. An alternative method holds body B stationary while the deposition of material M rotates about axis A. The preferred methods also include, but are not limited to, a combination of body and deposition rotations. A prescribed distribution of material M results in responsivity vectors that increase in magnitude with distance from axis A, a direct method of making a biaxer. A variant of the method creates a radial distribution of responsivity vectors that have equal magnitudes.

In an alternative method, the transducer body having a radial distribution of responsivity vectors of equal magnitudes, alters magnitudes by preferential irradiation. Referring to FIG. 20, body B is irradiated with energy M that increases in intensity with proximity to axis A, as indicated by the thinness of the arrows. Responsivity vector magnitudes are thereby adjusted downward to produce the distribution predetermined to result in a biaxer. Radially modulated radiations such as high energy electrons, short wavelength ultraviolet light, infrared, X-rays and gamma rays are used in accordance with the adjustability of the particular transducer body material. A combination of rotation of body B and rotation of energies M provides the radial distribution of responsivity adjustments appropriate to a biaxer. In place of rotation, a variant of the method uses flying spot scanning of radiation M.

The methods described herein for fabricating a biaxmorph are equally well used to make the twisting actuators of applicant's copending application Ser. No. 07/708,643 filed May 31, 1991 which is hereby incorporated by reference. The only difference between the twister type lamina and the biaxer lamina is the direction of the responsivity vectors. The responsivity vectors are annularly distributed in the twister lamina.

Figure 21:
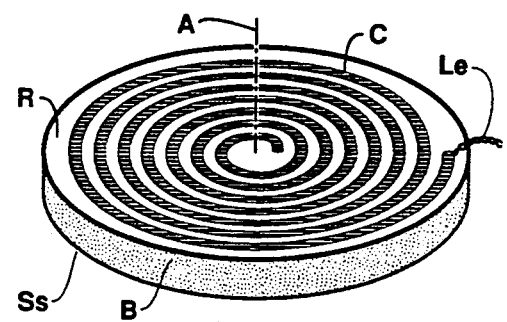
FIG. 21 depicts a method that activates a uniformly radially sensitized biaxer with a nonuniform electrical signal.

FIG. 21 illustrates a method of electrical activation that elicits biaxer response from the previously described transducer body B having a radial distribution of responsivity vectors of equal magnitudes. Common electrode C is applied to responsive surface R in a spiral about axis A. The electrode has electrical resistivity and geometry predetermined to impose an electrical stimulus on body B that has the radially decreasing magnitude on approach to axis A when an input signal is applied to lead Le, eliciting biaxer response from the uniformly radially responsive body B. Electrode C includes, but is not limited to, metals, cermets, semiconductors, and insulators with relatively high electrical conductivity.

A variant of the transducer body of FIG. 21 replaces spiral electrode C with a sheet electrode covering responsive surface R, wherein the sheet electrical properties assure that the intensity of the applied electrical signal is a slowly varying function of distance from axis A. The distribution of signal intensities in combination with the uniform responsivity of body B causes responsive surface R to execute a biaxial surface deformation.

Another variant of the transducer body of FIG. 21 replaces spiral electrode C with a segmented sheet electrode covering responsive surface R, wherein a separate intensity of a multiplicity of applied electrical signals is applied to a respective electrode segment, and alternatively, to an annulus of electrode segments, so that the effect of the applied electrical signals is a slowly varying function of distance from axis A. The distribution of signal intensities in combination with the uniform responsivity of body B causes responsive surface R to execute a biaxial surface deformation.

Figure 22:
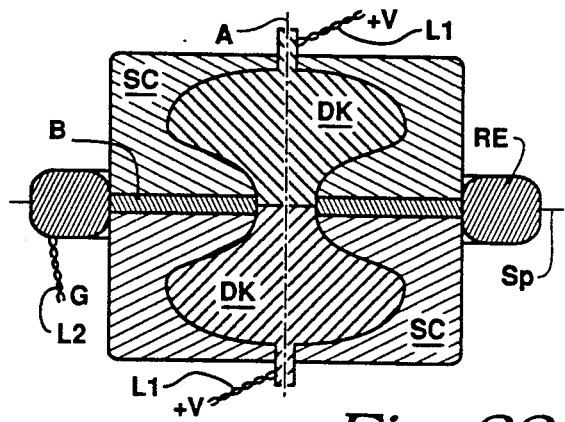
FIG. 22 is a cross section of an embodiment of the apparatus used in a method of sensitizing biaxers having a radial gradient electric field intensity.

FIG. 22 is a cross section of the presently preferred electric field intensity method and apparatus for making a biaxer comprising transducer body B, ring electrode RE, door knob electrodes DK, and electrical semiconductor material SC. The apparatus is symmetric about axis A, and mirror-symmetric about separation plane Sp. Electrical connections are made to the ring electrode by lead L2 and to door knobs DK by leads L1. Application of a stimulating electrical signal +V to leads L1, relative to lead L2 held at electrical ground G for reference. creates a radial gradient of electric field intensity about axis A. Semiconducting bodies SC, in concert with a predetermined shape of door knobs DK, distribute the electric field intensity to the values needed for the generation of the biaxer responsivity vector distribution. Transducer bodies B made of piezoelectric materials having relatively high dielectric constants require a similar material for bodies SC to achieve the desired radial electric field intensity distribution that entails a predetermined maximum dielectric stress value.

Figure 23:
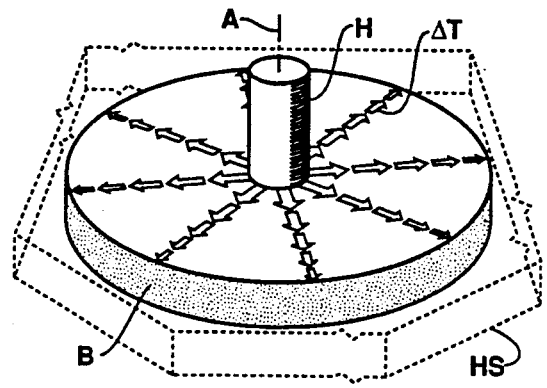
FIG. 23 portrays a thermal gradient method of adjusting a uniformly radially sensitized body to make a biaxer.

FIG. 23 is a partially phantomed view of the preferred thermal method of making a biaxer or a biaxmorph of the previously described transducer body B having a radial distribution of responsivity vectors of equal magnitudes. Heater H contacts body B near axis A and heat sink HS (dashed lines) contacts the edge of body B, creating a radial thermal gradient indicated by radially decreasing arrows ΔT. Gradient ΔT thermally adjusts the magnitudes of the previously created responsivity vectors of body B to the distribution appropriate to a biaxer. Using the foregoing piezoelectric transducer body example, an essentially uniformly radially polarized body has responsivity vectors progressively reduced from the initial magnitude at the disk edge, to a zero magnitude at axis A by thermal adjustment.

Biaxers and biaxmorphs made of electromechanically reciprocal materials transduce with equal alacrity in either direction. Therefore, reciprocal embodiments of the present invention serve as generators of electrical power when mechanically activated. Attachment of the biaxial transducer to a surface that produces biaxial surface deformations provides a means to extract a portion of the energy of deformation as electric signals and useful power. In addition to generating electric power, reciprocal, and desirably, each of the more linearly responsive embodiments of the present invention provides an electrical signal that is proportional to the average state of biaxial strain in the object to which it is attached.

A conventional biaxial straingage attached to an embodiment of the present invention may be activated in a known manner, providing the means of calibrating the straingage by electrical remote control, over a relatively wide range of strains, and without direct participation of any structural member to which the calibratable apparatus thus constituted is attached.

The reciprocal embodiments of the present transducer have mass, elasticity, and coupleable electrodeformation suitable for use as a resonant component of an electrical circuit. One use of the resonant application of the biaxer or biaxmorph attached to an elastic body is the stimulation of uncommon biaxial surface acoustic waves therein. Such waves comprise a controllable mix of at least two types of acoustic waves that may or may not propagate differently in the body, depending on the elastoacoustic properties thereof. Bodies having materials favoring differential or dispersive acoustic propagation are useful in the determination of body properties by electrical means, and in the measurement of body states resulting from external perturbations.

As an electromechanical resonator, the biaxer or biaxmorph, particularly the embodiments made of thin films, have a relatively small mass, a relatively small motional inertial moment, and a relatively large surface area, all of which favor relatively high resonance frequencies. Further, the radial distribution of transducer responsivity bears the instantaneous energy of resonance over the broad surface area of the transducer with a known and measurable distribution. Perturbation theory is used to deconvolve the interaction of distributed resonance energy and the passing of a perturbation, thereby enabling the indirect measurement of the nature of the perturbation.

What is claimed and desired to be secured by Letters of Patent of the United States is:

1. A transducer comprising,
   one lamina of electrodeformable material having responsivity vectors, a responsive surface, a support surface, and connections receptive of electric power attached to the lamina, wherein the responsivity vectors are radially distributed about an axis, and wherein power is transduced by said vectors with varying magnitude as a function of the radial distance from the axis to forcibly biaxially deform said responsive surface and the converse.

2. A transducer as in claim 1 wherein the responsivity vector's magnitude is constant as a function of the radial distance from said axis and the electric influence of said connections varies as a function of the radial distance from said axis.

3. A transducer as in claim 1 wherein the responsivity vector's magnitude varies as a function of the radial distance from said axis and the electric influence of said connections varies as a function of the radial distance from said axis.

4. A transducer as in claim 1 wherein the connections receptive to electric power are an electrode affixed to the responsive surface and an electrode affixed to the support surface.

5. A transducer as in claim 4 wherein two laminae are joined to a common electrode.

6. A transducer as in claim 5 wherein the directions of said responsivity vectors are antiparallel.

7. An actuator having a body comprising a lifter affixed to biaxer.

8. An actuator as in claim 7, wherein said body has a top and a bottom, the body having a plurality of lifters with a biaxer affixed at the top and a biaxer affixed at the bottom.

9. A transducer as in claim 2 wherein said electric influence is varied by means of said receptive connections having a spiral of electrically resistive material.

10. A transducer as in claim 3 wherein said electric influence is varied by means of said receptive connections having a spiral of electrically resistive material.

11. A transducer as in claim 4 wherein said electric influence is varied by means of said receptive connections having electrical resistivity that increases with proximity to said axis.

12. A transducer as in claim 5 wherein said electric influence is varied by means of said receptive connections having electrical resistivity that increases with proximity to said axis.

13. A transducer as in claim 4 wherein said electric influence is varied by means of a plurality of said receptive connections connected in annuluses, each annulus activated by a magnitude of said electric power that decreases with proximity to said axis.

14. A transducer as in claim 3 wherein said electric influence is varied by means of a plurality of said receptive connections connected in annuluses, each activated by a magnitude of said electric power that decreases with proximity to said axis.

15. A biaxial transducer comprising a substrate having an axis and a plurality of biaxer segments attached to the substrate.

16. A biaxial transducer as in claim 15 where the biaxers are biaxmorphs.

17. A biaxial transducer as in claim 15 where the biaxer segments are equally sized and spaced at equal intervals along arms of a set of involute spirals.

18. A biaxial transducer as in claim 17 where the biaxers are biaxmorphs.

19. A biaxial transducer as in claim 18 where there is a wafer attached to the biaxmorphs opposite the substrate.

20. A biaxial transducer as in claim 19 where the substrate has a cooling channel for fluid to pass through and remove heat from the substrate.

21. A deformable object comprising a substrate, a plurality of biaxer segments attached to the substrate, a deformable object attached to the biaxer segments, wherein the biaxers shear and bend the deformable object when the biaxers are activated.

22. A deformable object as in claim 21 where the biaxers are biaxmorphs.

* * * * *